United States Patent [19]

Lukas

[11] 4,039,930
[45] Aug. 2, 1977

[54] REMOTELY CONTROLLED PHASE SHIFTING CIRCUIT

[75] Inventor: Stephen J. Lukas, Waynesboro, Va.

[73] Assignee: General Electric Company, Salem, Va.

[21] Appl. No.: 713,889

[22] Filed: Aug. 12, 1976

[51] Int. Cl.² ............ G05F 1/68; H03K 1/12
[52] U.S. Cl. .................................. 323/108; 328/155
[58] Field of Search ............ 323/101, 106, 108, 129; 321/52, 54; 328/155; 307/262

[56] References Cited

U.S. PATENT DOCUMENTS

| 3,436,647 | 4/1969 | Gobeli et al. | 323/101 |
|---|---|---|---|
| 3,548,296 | 12/1970 | Sundström | 307/262 |
| 3,614,475 | 10/1971 | Deboo | 328/155 |
| 3,675,137 | 7/1972 | Raphael | 328/155 |
| 3,748,572 | 7/1973 | Kim | 323/106 |

OTHER PUBLICATIONS

"300 Series Voltage Tunable Active Filters", Data Sheet From Frequency Devices, Inc., Haverhill, Mass. Aug. 1971.

Primary Examiner—Gerald Goldberg
Attorney, Agent, or Firm—Arnold E. Renner; Philip L. Schlamp

[57] ABSTRACT

A circuit for shifting the phase of an input voltage provides an output voltage of the same magnitude but of a phase differing from that of the input voltage by a variable amount in accordance with a selectively variable control input.

14 Claims, 7 Drawing Figures

REMOTELY CONTROLLED PHASE SHIFTING CIRCUIT

BACKGROUND OF THE INVENTION

The present invention relates generally to phase shifting circuits and more particularly to a phase shifting circuit of the type in which the amount of phase shift may be controlled or varied.

There are many existing circuits which provide a shift in the phase of an input signal. Perhaps the simplest and best known types of these circuits include various combinations of inductive, capacitive and resistive components which may be fixed, to provide a fixed shifting of phase, or variable for allowing a changing of the phase shift. A number of these circuits result in at least some degree of attenuation. Known circuits satisfy most applications for which a phase shifting is desired. They do, however, suffer generally from certain defects including a lack of stability resulting from component value variation due to aging, temperature changes, etc. More importantly however, known circuits for this purpose generally suffer from the lack of being readily adjustable from a remote location. That is, while it may be relatively easy for an operator to adjust a potentiometer or a variable capacitor or inductance by physically turning a knob or similar adjustment mechanism, the ability to perform this function remotely is difficult. Quite often, the remote adjustment of such a circuit requires the use of selsyn systems, or the like, which renders the overall system not only expensive but also difficult to control with accuracy.

The need for an accurate, remotely controllable phase shifting circuit or network recently became apparent in the control of subsynchronous resonance in a turbine/generator system. subsynchronous resonance occurs in a turbine/generator system due to the fact that some transmission lines have a resonance which is at a lower frequency than the generating system frequency. This line resonance frequency, when fed back into the turbine/generator system results in a "beat" frequency which sets up torsional forces in the shafts interconnecting the various masses of the turbine/generator system. These torsional forces have been known to actually cause breakage failure of the shafts. It has been found that these subsynchronous resonant frequencies tend to be of particular values and are especially pronounced, in their effects, at certain regions within the turbine/generator system. It has also been found that, by employing suitable phase shifting techniques in the control of the generator, these problems can be lessened. While the present invention found initial application in the solution of the subsynchronous resonance problem, it will be apparent from the following description that the invention has general applicability.

SUMMARY OF THE INVENTION

It is, therefore, an object of the present invention to provide an improved, controllable phase shifting circuit.

It is another object to provide a phase shifting circuit which is remotely controllable.

It is a further object to provide a phase shifting circuit which is remotely controllable to provide an output signal equal in magnitude to an input signal but shifted in phase therefrom by a predeterminable amount which is the function of a variable control signal.

The foregoing and other objects are achieved in accordance with the present invention by providing first and second summation means to each of which is applied an input voltage. The output of the second summation means is fed back to form a second input to the first summation means. Intermediate the two summation means, responsive to the output of the first summation means, is a circuit which provides a specified transfer function and the output of this circuit serves as a second input to the second summation means. The circuit intermediate the summation means is responsive to an input control signal for selectively varying the amount of phase shift of the input voltage resulting in phase shifted output voltage from the second summation means.

BRIEF DESCRIPTION OF THE DRAWING

While the present invention is particularly defined in the claims annexed to and forming a part of this specification, a better understanding can be had from the following description taken in conjunction with the accompanying drawing, in which:

DETAILED DESCRIPTION

Figure 1:
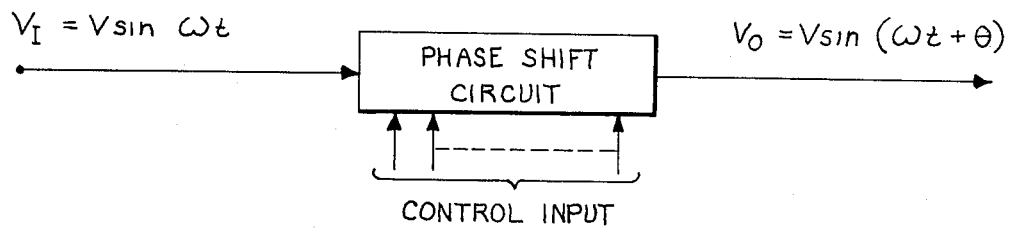
FIG. 1 is a block diagram illustrating the desired overall function accomplished by the present invention.

FIG. 1 illustrates the present invention in its highest level block form. As shown in FIG. 1, a block labeled Phase Shift Circuit has an input signal $V_I$ which is eaual to $V\sin\omega t$. the output of the Phase Shift Circuit block $V_O$ is equal to $V\sin(\omega t + \theta)$. The angle $\theta$ is a function of a control input diagramatically illustrated in FIG. 1 and so labeled.

In order to achieve the desired results as illustrated in FIG. 1, it was determined that the Phase Shift Circuit of FIG. 1 should have a transfer characteristic defined by the equation, $$F(S) = -(K-TS)/(K+TS) \tag{1}$$

wherein:
S = Laplace operator equal $\sigma + j\omega$
K = control variable
T = time constant of the Phase Shift Circuit.

With respect to the Laplace operator S, it should be noted that $\sigma$ is equal to zero for a sinusoidal input.

In the present invention it is desired to provide a circuit which provides unity gain and a phase shift of $(\theta)$ as a function of a control variable. That equation (1) provides this desired result may be shown by the following. Expressing equation (1) in terms of $j\omega$, remembering that for a sinusoid $\sigma = 0$, gives:

$$F(j\omega) = (-K + j\omega T)/(K + j\omega T). \tag{2}$$

Expressed in terms of absolute magnitude, equation (2) is equal to:

$$|F(j\omega)| = \frac{\sqrt{(-K)^2 + (T\omega)^2}}{\sqrt{(K)^2 + (T\omega)^2}} = 1. \quad (3)$$

Thus, the gain of the transfer characteristic of the circuit of equation (1) is unity.

The phase shift ($\theta$) can be shown to be:

$$\theta = \pi + \text{Tan}^{-1}\left(-\frac{T\omega}{K}\right) - \text{Tan}^{-1}\left(\frac{T\omega}{K}\right); \text{or,} \quad (4)$$

$$\theta = 2\,\text{Tan}^{-1}\left(\frac{K}{T\omega}\right). \quad (5)$$

From equation (5) it is seen that the phase shift is a function of the term ($K/T\omega$). As such, if the circuit of the invention has an input voltage of a single frequency, for example as being derived from the output of a highly tuned filter, the term $\omega$ will be a constant. The term T is also a constant as determined by the components of the circuit. The term ($T\omega$) will, therefore, be a constant and the phase shift of the circuit is solely a function of the factor K, the controlled variable.

Having established that equation (1) gives the desired characteristics of the circuit, that is a unity gain and a phase shift $\theta$ as a function of the controlled variable K, equation (1) can be expressed in the terms of $V_I$ and $V_O$ as:

$$F(S) = \frac{V_O}{V_I} = \frac{-K + TS}{K + TS}; \text{or,} \quad (6)$$

$$V_O = -\frac{K}{TS}(V_O + V_I) + V_I. \quad (7)$$

Figure 2:
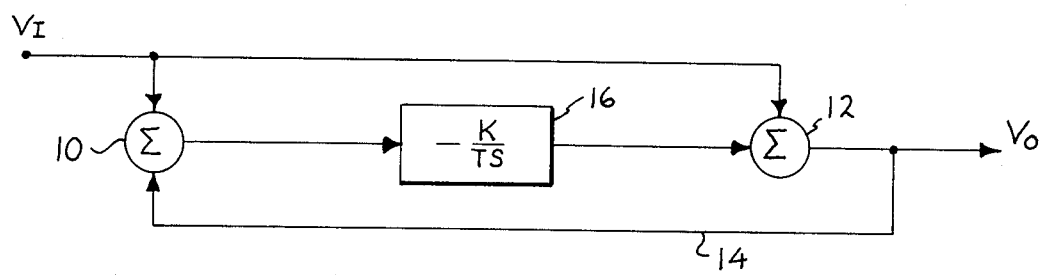
FIG. 2 is a high level schematic block diagram showing the present invention.

From equation (7) the block diagram of FIG. 2 can be derived. As shown in FIG. 2, an input signal $v_I$ serves as one input to two summation means or summing junctions 10 and 12. The output of the summing junction 12, designated $V_O$, is tied back by means of a line 14 to serve as a second input to the summing junction 10. Intermediate the two summing junctions is a block 16 which is shown as having the transfer characteristic $-(K/TS)$. Block 17 receives the output of the summing junction 10 and provides the second input to the summing junction 12.

Figure 3:
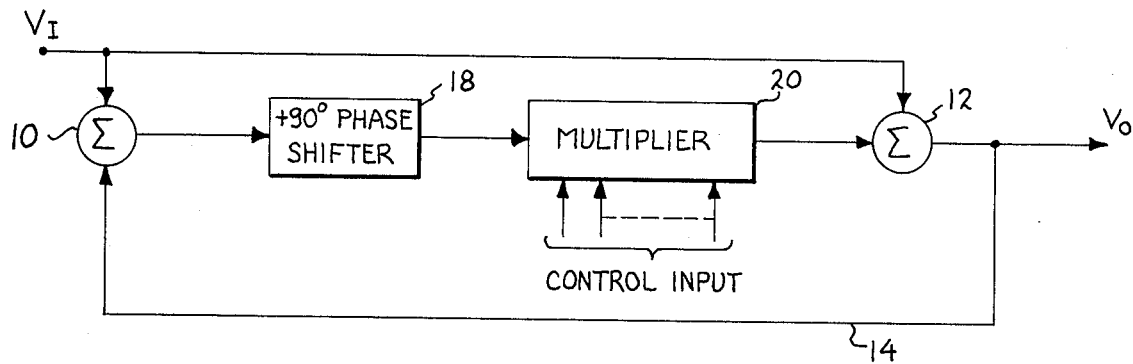
FIGS. 3 and 4 are high level schematic diagrams showning, in block form, further development of the circuit of FIG. 2.

It will be remembered that, as previously stated, for a sinusoid the Laplace operator S is equal to $j\omega$ and that, because the circuit is of fixed components, the time constant T will be fixed for a given circuit. As such, the block configuration of FIG. 2 can be expanded to that shown in FIG. 3 when it is recognized that $-1/j\omega$ is equal to a plus 90° shift in phase. Thus, FIG. 3 shows that, as before, the input voltage $V_I$ forms an input to each of two summing junctions 10 and 12 and the output of the junction 12 forms a second input to the junction 10. Block 16 of FIG. 2 is represented in FIG. 3 by two components identified as a +90 Degree Phase Shifter 18 and a multiplier 20. In FIG. 3, the phase shifter 18 provides the term 1/S while the constant T can, for the present, be ignored. Multiplier 20 has a control input applied thereto and it is this multiplier which provides the control variable K as specified by equation (7).

Figure 4:
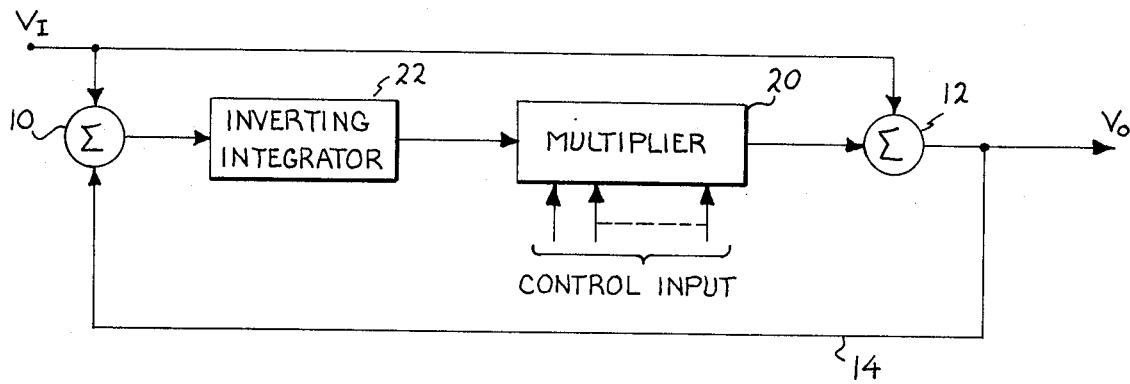

Remembering that the input voltage $V_I$ is sinusoid and recognizing that the integral of the sine is the negative cosine, the +90 Degree Phase Shifter 18 may be replaced by an inverting integrator and this configuration is shown in FIG. 4. FIG. 4 is identical to FIG. 3 with the exception that the integrator 22 has replaced the more generic component, the +90 Degree Phase Shifter 18. As before, in FIG. 4 the multiplier 20 with its control input provides the control variable K and thus it is seen that FIG. 4 is the full equivalent of the circuit of FIG. 3 for a sinusoid input.

From equation (5), that is $\theta = 2\text{Tan}^{-1}(K/T\omega)$, it is seen that if K is varied between zero and infinity then the angle $\theta$ will vary between zero and 180°. It is, of course, impratical if not impossible to achieve an infinite gain in a multiplier and, therefore, in the actual implementation of the present invention a lesser number of degrees phase shift was selected for a single stage of the phase shifting circuit of the present invention. In the actual implementation of the present invention, the amount of shift which a single stage is capable of achieving was limited to 120° which corresponds of a range of K from zero to $\sqrt{3}$.

Figure 5:
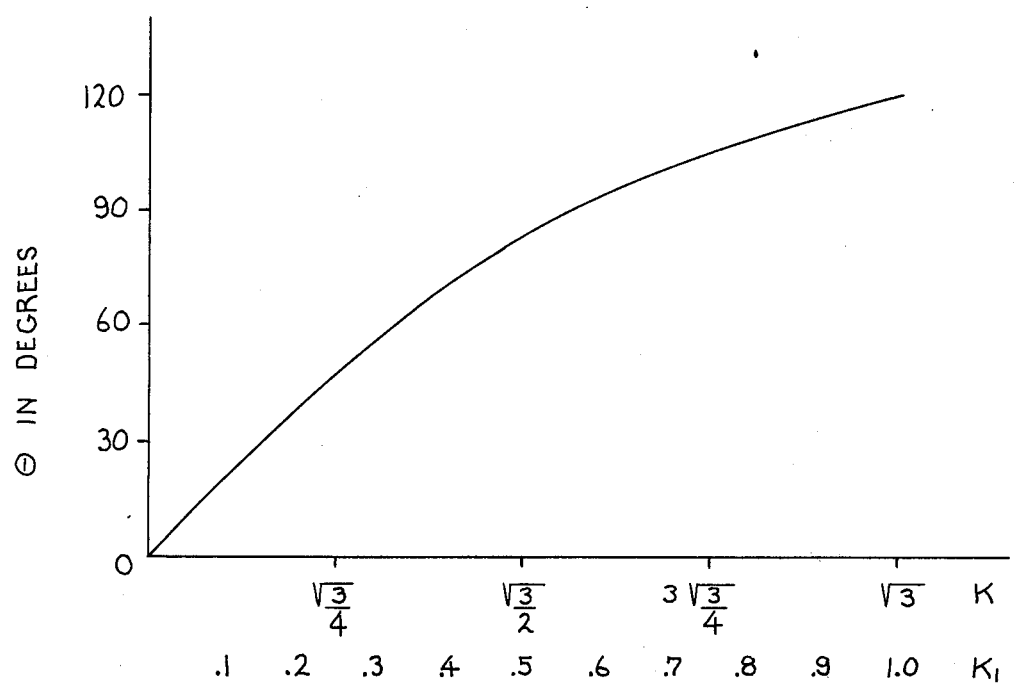
FIG. 5 is a graph which is useful in understanding the present invention.

FIG. 5 which plots the phase shift $\theta$ as the ordinate and values of K as the abscissa, illustrates the amount of phase shift which is achieved in the present invention. As seen in FIG. 5, for a value of K equal to $\sqrt{3}/2$ there will be a phase shift of approximately 82°. A multiplication factor K of $\sqrt{3}$ corresponds to a 120° phase shift.

Figure 6:
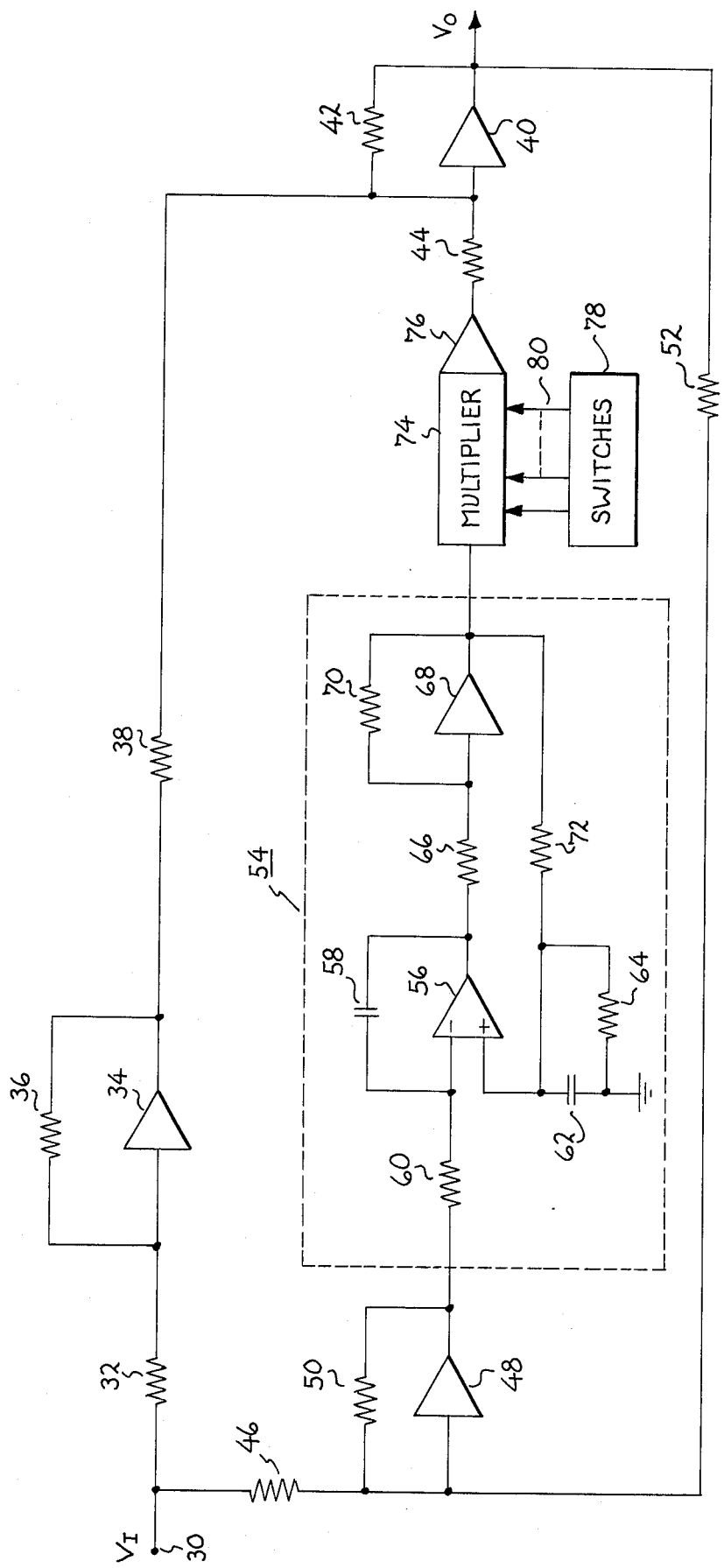
FIG. 6 is a schematic diagram illustrating the circuit of the present invention in its preferred embodiment; and, FIG. 7 is a high level block diagram showing the application of the present invention to achieve a phase shift of from zero to 360°.

FIG. 6 illustrates the means by which the present invention was actually implemented utilizing operational amplifiers and standard commercially available components as will be further identified. Before proceeding with a discussion of FIG. 6, certain preliminary comments are believed appropriate. Firstly, most of the operational amplifiers in FIG. 6 are shown with only a single input. This was done for the sake of simplicity and it is to be understood that, when only a single input is shown for an operational amplifier, that input is to be taken as being applied to the inverting input of the amplifier and the noninverting input will be connected to ground by a suitable resistor, if necessary, all in a manner well known to those skilled in the art and in accordance with good engineering practices. Further, it should be noted that the FIG. 6 depiction includes several inverting stages which did not appear in the earlier figures. The use of these inverters is not necessitated by the invention itself but is occasioned by the fact that present day commercially available operational amplifiers are more easily and precisely employed if the inverting input rather than the noninverting input is used. This use results in the inversion of signals which must be compensated for by additional inversions but this does not in any way detract from the actual implementation of the concept of the present invention.

Referencing now FIG. 6, it is seen that an input voltage $V_I$ is applied to an input terminal 30 and by way of an input resistor 32 to an operational amplifier 34 having a feedback resistor 36 connected between its output and its input. Amplifier 34, with its associated resistors, forms an inverter and the output of the amplifier 34 is applied by way of an input resistor 38 to a summing inverter 40 which is provided with a customary feedback resistor 42 connected between its output and its input. The second input to the amplifier 40 is by way of a resistor 44. In this implementation of the present invention, amplifier 34 has unity gain and amplifier 40 provides a gain of $2\sqrt{3}$ for the input signal applied by way of resistor 44 and a unity gain for the input signal applied by way of resistor 38 as will be more fully explained hereinafter. The input signal $V_I$ at terminal 30 is also applied by way of an input resistor 46 to an amplifying inverting amplifier 48 having a feedback resistor 40 connected between its input and its output. A second input to the amplifier 48 is by way of a resistor 52 which receives a signal from the output of the amplifier 40. As will be more fully understood as this description proceeds, the amplifier 48 and its associated circuitry performs the summation of the two input signals and an amplification equal to one-half.

The output of amplifier 48 serves as an amplifier 48 serves an an input to the circuitry shown within the dashed line box 54 which corresponds to the integrator 22 of FIG. 4. Included within the dashed line box 54 and receiving the output signal from the amplifier 48 is an input resistor 60 which is connected to the inverting input of an operational amplifier 56 having a capacitor 58 connected between its output and that input. The output of the amplifier 56 is connected by way of an input resistor 66 to an additional operational amplifier 68, having a feedback resistor 70 connected between its output and its input, which performs an inverting function. The output of amplifier 68 is fed back by way of a resistor 72 to the noninverting input of amplifier 56. This noninverting input is further connected to ground by way of the parallel connection of a capacitor 62 and a resistor 64. Resistors 64 and 72 and capacitor 62 form a low pass filter. It will be recognized by those skilled in the art that the depiction within the dashed line block 54 amounts to an inverting integrator in cascade arrangement with an inverter with a feedback path from the latter to the former. This particular arrangement was found desirable because of the extremely high gain of the integrating circuit alone and is designed to provide, in combination, an integration function at unity gain at a prescribed frequency. Thus, the function performed by that circuitry within the block 54 is, at the design input frequency, equivalent to a pure integration function.

The output of the integrator 54 forms an analog input to a multiplier 74 which, in the present implementation is a purchased component from Analog Devices of Norwood, Mass. and is identified by their number AD7520. This multiplier provides a multiplication function and is normally used with an inverting operational amplifier at its output as illustrated by the triangular section 76. This particular multiplier outputs a signal which is the product of an analog signal (in FIG. 6, the output of amplifier 68) and the value of a digital control signal. In FIG. 6, the digital signal is illustrated as being derived from a plurality of switches, represented by box 78, which are connected to the multiplier by lines 80. In the particular multiplier here utilized, ten binary inputs are permitted. Thus, by the setting of the switches in block 78 to the desired 1 and 0 configuration, the appropriate multiplication factor can be applied to the analog input signal to provide an output which serves, by way of resistor 44 as a second input to the summation inverter 40. The output of the summation inverter 40, the desired output signal $V_O$, is equal in magnitude to the input signal $V_I$ but displaced in phase therefrom by a desired amount as determined by the value of the digital control signal, i.e., here the setting of the switches 78.

In view of the previous discussion, particularly that of FIG. 4, a detailed discussion of the operation of the circuit of FIG. 6 is believed unnecessary. There are, however, several design features of the FIG. 6 implementation which should be explained to fully satisfy the reader that this circuit does, in fact, meet the requirements set forth in equation (7). The nature of the multiplier 74, as purchased, was such that it did not readily lend itself to a multiplication of from 0 to the $\sqrt{3}$, but did, in its common usage, provide a multiplication of from 0 to 1. Accordingly, the factor K of the equations was divided into two parts or subfactors, $K_1$ and $K_2$. The subfactor $K_2$ was made equal to $\sqrt{3}$ and assigned to the amplifiers 48 and 40 while the subfactor $K_1$ was assigned to the multiplier 75 and is controllably variable between 0 and 1. FIG. 5, utilizing the lower abscissa scale labeled $K_1$, illustrates how varying values of $K_1$ affect the phase shifting of the present invention.

In the implementation of the present invention in accordance with the instant example, subfactor $K_2$ was shared by amplifiers 48 and 40 as earlier noted. As previously mentioned, summing inverter 48 was given a multiplication factor (gain) of one-half for each of its two input paths. As is customary in the art, this is achieved by making the values of resistors 46 and 52 twice that of resistor 50. Also, as previously stated, amplifier 40 has a unity gain for the signal applied via resistor 38 and a gain of $2\sqrt{3}$ for the signal applied by way of resistor 44. Thus, the values of resistors 38 and 42 would be, respectively, to and $2\sqrt{3}$ times as large as the value of resistor 44. From the foregoing it is seen that equation (7) has been satisfied in that the product of the gains of the two amplifiers 48 and 40 for the path including those two amplifiers is equal to $\sqrt{3}$, the value of the subfactor $K_2$ in the present example. It should be specifically noted that the multiplication (gain) of the several amplifiers is arbitrary within the limits of the capabilities of the components selected. The selection of the multiplier will, of course, be of prime concern. The saturation level of the amplifiers must also be considered. For example, in an early implementation of the present invention an attempt was made to give amplifier 48 a gain of $\sqrt{3}$ for both input paths and to employ a unity gain for both input paths of amplifier 40. Because of the signal levels involved, this resulted in a tendency for amplifier 48 to saturate and to correct this problem the values as set forth in the above example were selected. The important consideration is that the total gain of each of the paths be that desired without overextending the capabilities of the components selected.

As was mentioned, the multiplier 74 actually used was one which multiplied an analog input by an amount determined by a digital control input. This particular multiplier was selected in the implementation of the present invention for several reasons. First of all, digital signals as a control input tend to be more stable and less susceptible to noise than are analog signals. Additionally, in the particular implementation used, digital signals for control purposes were readily available or could be simply implemented through the use of switches. It is to be understood, however, that an analog multiplier would function with equal facility in many applications and such usage is contemplated within the present invention.

Further comment is believed desirable about the circuitry within the block 54, generally referred to as the integrator. It was stated above that the components of this circuit were selected to provide a unity gain at the input frequency. Because this particular invention found initial application in a situation in which the frequency of the input voltage ($V_I$) was very stable, no problem was posed. It is, however, recognized that if the input frequency were to change, the gain of this integrator would also change. Thus, a change in the frequency of the input voltage $V_I$ would require a different value of the digital control input to achieve a corresponding shift in phase. As such, although the present invention was first employed in a single frequency application, its utility is not so limited.

Figure 7:
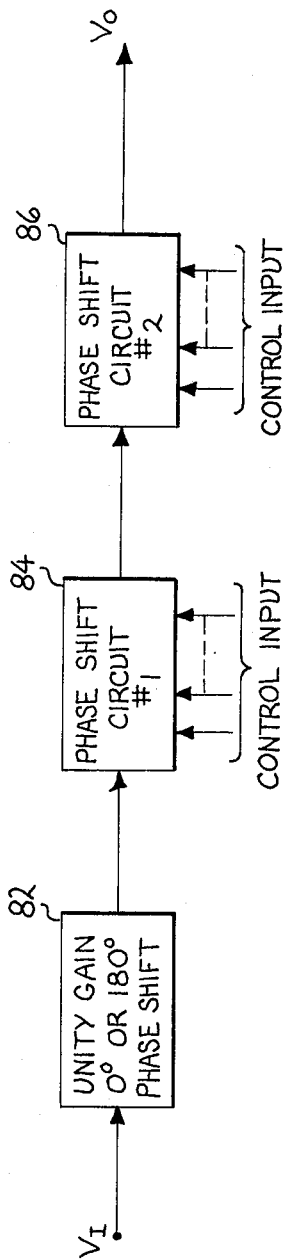

If a greater phase shift than that designed into a single unit (i.e., that shown in FIG. 6) is desired, the circuitry shown in block form in FIG. 7 can be employed. This configuration permits a phase shift of from 0° to 360°. As shown in FIG. 7, the signal $V_I$ is first applied to block 82 which provides unity gain and may be selectively switched to provide either a 0° or 180° phase shift. This block may take the form of a selectively effective inverter having unity gain. The output of the block 82 is applied as in input to block 84 which is a first unit of the present invention such as that shown in FIG. 6. Block 84 is cascaded with a second block 86 which may be identical to block 84. Each of the units 84 and 86 has a control input as illustrated. The output of the second unit 86 is the signal $V_O$. From the above, an addition of the possibilities; that is, 0 or 180, 0-120 shows that complete control of phase shifts from 0 to over 360° is possible. From the preceding it is seen that the network of FIG. 7, as described, is capable of a 420° phase shift. As such, it is apparent that units 84 and 86 each need not be capable of a 120° phase shift but only that the sums of their possible phase shifts be equal to at least 180°. Thus, although in normal practice substantially identical units would be used, this is not a requirement.

It is recognized that results identical to those resulting from the FIG. 7 configuration could be achieved by the cascade arrangement of three or more units such as 84 or 86 in FIG. 7. In practice, however, this turned out to be a more expensive solution to the 360° phase shift requirement than the arrangement shown in FIG. 7.

Thus, it is seen that there has been provided a relatively simple and inexpensive circuit which in response to a controllable input signal, which may be of remote origin, provides an accurate and predictable phase shift to present an output signal which is of the same magnitude but shifted in phase from the input signal in accordance with the control input signal.

While there have been shown and described what are at present considered to be the preferred embodiments of the present invention, modifications thereto will readily occur to those skilled in the art. The possible substitution of an analog multiplier has been mentioned. Other types of multipliers could also be used. Also, it is to be readily understood that while switches were illustrated as the control input to the multiplier, other forms could be used. For example, the control input could be derived from feedback signals proportional to temperature, transmission line variations, etc. In addition, the nature of the feedback signal is not of importance to the present invention. If such feedback signal were analog and an analog multiplier were used, then the signal could possibly be used directly with proper scaling. An analog feedback signal to the implementation herein illustrated could be employed through the use of one of the many digital to analog converters known in the art. It is not desired, therefore, that the invention be limited to the specific arrangements shown and described and it is intended to cover in the appended claims all such modifications as fall within the true spirit and scope of the invention.

What is claimed is:

1. A circuit for shifting the phase of an input voltage to provide an output voltage of substantially the same magnitude but having a phase differing from that of the input voltage by the amount of the phase shift, said circuit comprising:
    a. first and second summation means for receiving input signals and for providing output signals, the output of said second summation means constituting said output voltage;
    b. means for applying the input voltage as an input signal to both said first and said second summation means;
    c. means for applying the output signal of said second summation means as a second input signal to said first summation means;
    d. circuit means responsive to the output signal of said first summation means to provide a second input to said second summation means said circuit means combining with said first and second summation means to provide a transfer function equal in magnitude to K/TS wherein,
        $K$ = a control variable
        $T$ = time constant of the circuit means
        $S$ = Laplace transformer operator; and,
    e. means connected to said circuit means for selectively controlling the value of said control variable K.

2. The invention in accordance with claim 1 wherein said circuit means includes the series arrangement of a phase shifting circuit for receiving the output of said first summation means and a multiplier responsive to a control signal to selectively control the value of the variable K.

3. The invention in accordance with claim 2 wherein said multiplier is a digital multiplier responsive to a digital control signal for selectively controlling the value of the variable K.

4. The invention in accordance with claim 2 wherein said phase shifting circuit includes an integrator.

5. The invention in accordance with claim 2 wherein said phase shifting circuit includes an integrator circuit having a gain of approximately unity at a prescribed frequency of said input voltage.

6. A circuit for providing an output voltage having the same magnitude as that of an input voltage but differing in phase from said input voltage by a controllable amount comprising:
    a. first and second amplifying summation circuits responsive to input signals to provide output signals as a function thereof, each of said summation circuits having an amplification factor the product of which is equal to a first constant $K_2$;
    b. means to apply said input voltage as a first input signal to each of said summation circuits;
    c. means for applying the output signal of said second summation circuit as a second input signal to the first summation circuit;
    d. circuit means responsive to the output signal of said first summation means to provide a second input signal to said second summation circuit, said circuit means having a transfer function equal in magnitude to $K_1/TS$ wherein,
        $K_1$ = a control variable, $T$ = time constant of the circuit means,
$S$ = Laplace transformer operator; and,
e. means connected to said circuit for selectively controlling the value of said control variable $K_1$.

7. The invention in accordance with claim 6 wherein said circuit means includes the series arrangement of a phase shifting circuit for receiving the output of said first summation circuit and a multiplier responsive to a control signal to selectively control the value of the variable $K_1$.

8. The invention in accordance with claim 7 wherein said multiplier is a digital multiplier responsive to a digital control signal for selectively controlling the value of the variable $K_1$.

9. The invention in accordance with claim 8 wherein said multiplier is selectively variable to control the value of the variable $K_1$ between zero and unity.

10. The invention in accordance with claim 7 wherein said phase shifting circuit includes an integrator.

11. The invention in accordance with claim 7 wherein said phase shifting circuit includes an integrator circuit having a gain of approximately unity at a prescribed frequency of said input voltage.

12. The invention in accordance with claim 9 wherein the product of the amplification factors of said first and second summation circuits corresponds to the maximum amount of phase shift desired by the entire circuit.

13. A network for providing an output signal which is substantially equal in magnitude to an input signal but shifted in phase therefrom by a controllable amount including the range of 0° to 360° comprising:
a. a cascade arrangement responsive to said input signal including,
 1. means to selectively provide a phase shift of either 0° or 180° at unity gain,
 2. first and second phase shifting circuits each having a selectively controllable phase shift the sum of the maximum amounts of which equals at least 180°, each of said circuits responsive to an input voltage signal of the same frequency and having an overall transfer function defined by, $$F(S) = (-K + TS)/(K + TS)$$

wherein,
$F(S)$ = transfer function of the circuit
$T$ = time constant of the circuit
$S$ = Laplace transformer operator
$K$ = controlled variable; and,
b. means to individually control the variable of each of said phase shifting circuits.

14. The invention in accordance with claim 13 wherein said phase shifting circuits are substantially identical and each is capable of a phase shift of from zero to greater than 90° but less than 180°.

* * * * *